United States Patent
Weathers et al.

(10) Patent No.: US 11,403,031 B2
(45) Date of Patent: Aug. 2, 2022

(54) SYSTEMS AND METHODS FOR ENCODING AND DECODING DATA

(71) Applicant: Microsoft Technology Licensing, LLC, Redmond, WA (US)

(72) Inventors: Anthony D. Weathers, San Diego, CA (US); Majid Anaraki Nemati, San Diego, CA (US); Pablo A. Ziperovich, San Diego, CA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 268 days.

(21) Appl. No.: 16/682,311

(22) Filed: Nov. 13, 2019

(65) Prior Publication Data

US 2021/0141558 A1    May 13, 2021

(51) Int. Cl.
*G06F 11/00* (2006.01)
*G06F 3/06* (2006.01)
(Continued)

(52) U.S. Cl.
CPC .......... *G06F 3/0655* (2013.01); *G06F 3/0604* (2013.01); *G06F 3/0673* (2013.01);
(Continued)

(58) Field of Classification Search
CPC .... G06F 3/0655; G06F 3/0604; G06F 3/0673; G06F 11/1068; G06F 11/1012;
(Continued)

(56) References Cited

U.S. PATENT DOCUMENTS

| 7,590,927 B1 * | 9/2009 | Shih .................. | H03M 13/4138 |
| | | | 714/795 |
| 8,437,431 B1 * | 5/2013 | Piesinger ............ | H04L 27/2067 |
| | | | 375/324 |

(Continued)

OTHER PUBLICATIONS

Anderson, et al., "Glass: A New Media for a New Era?", In Proceedings of the 10th USENIX Workshop on Hot Topics in Storage and File Systems, Jul. 9, 20018, 6 Pages.
(Continued)

*Primary Examiner* — Albert Decady
*Assistant Examiner* — Osman M Alshack
(74) *Attorney, Agent, or Firm* — Holzer Patel Drennan

(57) ABSTRACT

A method for data retrieval includes receiving a set of probability metrics. A set of probability metrics is received for each one of a plurality of read values, and each probability metric of the set of probability metrics corresponds to a statistical likelihood that the read value is representative of one of a number of symbols. The symbols define a set of allowed transitions between a number of states, and a series of successive allowed transitions between states define allowed paths between the states. The method further includes determining a survival path between the states. The survival path is based on an accumulation of probability metrics corresponding to the statistical likelihood that successive ones of the plurality of read values are representative of successive ones of the symbols defining each transition in the survival path. The method further includes decoding a symbol stream based on the survival path.

16 Claims, 7 Drawing Sheets

(51) Int. Cl.
*G06N 20/00* (2019.01)
*G06F 11/10* (2006.01)
*G06N 7/00* (2006.01)
*H03M 13/11* (2006.01)

(52) U.S. Cl.
CPC ........... *G06F 11/1068* (2013.01); *G06N 7/00* (2013.01); *G06N 20/00* (2019.01); *H03M 13/1102* (2013.01)

(58) Field of Classification Search
CPC ..... G06N 20/00; G06N 7/00; H03M 13/1102; H03M 13/27; H03M 13/41; H03M 13/256
USPC .......................... 714/762, 764, 800–805, 795
See application file for complete search history.

(56) References Cited

U.S. PATENT DOCUMENTS

| | | | | |
|---|---|---|---|---|
| 8,634,152 | B1* | 1/2014 | Yang | H04L 1/005 360/39 |
| 2004/0240590 | A1* | 12/2004 | Cameron | H03M 13/3927 375/340 |
| 2005/0074070 | A1* | 4/2005 | Betts | H04L 25/03343 375/265 |
| 2010/0246686 | A1* | 9/2010 | Pezeshk | G11B 20/10277 375/240.25 |
| 2012/0079353 | A1* | 3/2012 | Liikanen | G11C 16/3431 714/773 |
| 2012/0210197 | A1* | 8/2012 | Jang | H04L 1/0054 714/799 |
| 2014/0270013 | A1* | 9/2014 | Ahuja | H04L 1/0047 375/341 |
| 2014/0359394 | A1* | 12/2014 | Gasanov | H03M 13/2957 714/758 |
| 2015/0371714 | A1* | 12/2015 | Karakulak | G11C 29/56 365/185.02 |
| 2017/0359146 | A1* | 12/2017 | Yang | H04L 1/005 |
| 2019/0354283 | A1* | 11/2019 | Rowstron | G06F 3/0677 |

OTHER PUBLICATIONS

Forney, G. David, Jr., "The Viterbi Algorithm", In Proceedings of the IEEE vol. 61 Issue 3, Mar. 1, 1973, pp. 268-278.

"International Search Report and Written Opinion Issued in PCT Application No. PCT/US2020/058992", dated Feb. 1, 2021, 13 Pages. (MS# 407584-WO-PCT).

* cited by examiner

SYSTEMS AND METHODS FOR ENCODING AND DECODING DATA

FIELD OF THE DISCLOSURE

The present disclosure is related to systems and methods for encoding and decoding data in an unreliable storage media such as a silica storage media.

BACKGROUND

Silica storage media is a type of storage media that uses lasers to read and write units of storage known as voxels into quartz glass. The information density achievable using silica storage media is much higher than conventional optical storage media, and data stored on the silica storage media is both permanent and stable. Data is stored, for example, by changing the retardance and polarization of a read/write unit known as a voxel, where retardance can be used to model amplitude and polarization can be used to model phase. Each voxel may store several bits in the form of a symbol that is defined by its polarization only (i.e., phase shift keyed) or by both its polarization and retardance (i.e., quadrature amplitude modulated). While silica storage media shows great promise for being able to permanently store large quantities of data in a stable way, it is also prone to write and read errors. Accordingly, there is a need for systems and methods for encoding and decoding errors for silica storage media that increase the reliability of writing to and reading from the media.

SUMMARY

In one embodiment, a method for data retrieval includes receiving a set of probability metrics. A set of probability metrics is received for each one of a plurality of read values, and each probability metric of the set of probability metrics corresponds to a statistical likelihood that the read value is representative of one of a number of symbols. The symbols define a set of allowed transitions between a number of states, and a series of successive allowed transitions between states define allowed paths between the states. The method further includes determining a survival path between the states. The survival path is based on an accumulation of probability metrics corresponding to the statistical likelihood that successive ones of the plurality of read values are representative of successive ones of the symbols defining each transition in the survival path. The method further includes decoding a symbol stream based on the survival path determined using the probability metrics calculated from the read values. By using the probability metrics to determine the survival path, the data retrieval system may be used with storage systems having non-Gaussian outputs such as silica storage systems. The data retrieval system may decrease a bit error rate of such systems.

In one embodiment, a data retrieval device includes processing circuitry and a memory coupled to the processing circuitry. The memory stores instructions, which, when executed by the processing circuitry cause the data retrieval device to receive a set of probability metrics. A set of probability metrics is received for each one of a plurality of read values, and each probability metric of the set of probability metrics corresponds to a statistical likelihood that the read value is representative of one of a number of symbols. The symbols define a set of allowed transitions between a number of states, and a series of successive allowed transitions between states define allowed paths between the states. The memory stores further instructions to cause the data retrieval device to determine a survival path between the states. The survival path is based on an accumulation of probability metrics corresponding to the statistical likelihood that successive ones of the plurality of read values are representative of successive ones of the symbols defining each transition in the survival path. The memory stores further instructions to cause the data retrieval device to decode a symbol stream encoded by the read values based on the survival path. By using the probability metrics to determine the survival path, the data retrieval system may be used with storage systems having non-Gaussian outputs such as silica storage systems. The data retrieval system may decrease a bit error rate of such systems.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1:
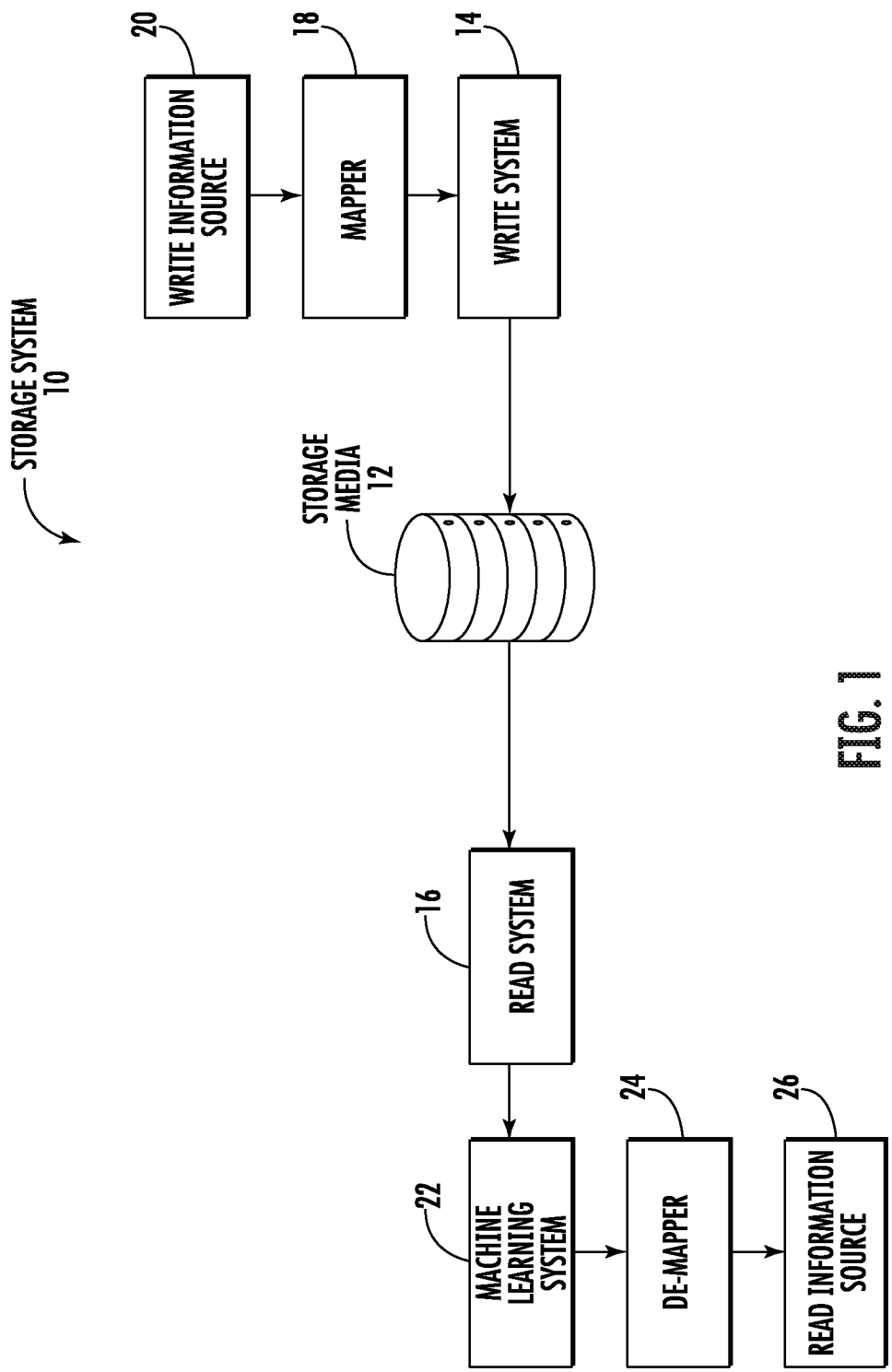
FIG. 1 illustrates a storage system according to one embodiment of the present disclosure.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

FIG. 1 shows a storage system 10 according to one embodiment of the present disclosure. The storage system 10 includes storage media 12 coupled to a write system 14 and a read system 16. The write system 14 is coupled to a mapper 18, which is in turn coupled to a write information source 20. The read system 16 is coupled to a machine learning system 22, which is in turn coupled to a de-mapper 24, which is in turn coupled to a read information source 26.

To write data to the storage media 12, information from the write information source 20 is provided to the mapper 18 as a bit stream. The mapper 18 encodes the bit stream to a symbol stream, for example, using phase shift keying (PSK), quadrature amplitude modulation (QAM), or any other modulation scheme. The symbol stream is provided to the write system 14, which facilitates writing of the symbol stream to the storage media 12.

To read data from the storage media 12, the read system 16 obtains read values from the storage media 12 and provides the read values to the machine learning system 22. The storage media 12 may be a silica optical storage media. Accordingly, obtaining the read values from the storage media 12 generally includes observing the read values via one or more images captured by one or more cameras. The read values are representative of symbols in a symbol stream. The machine learning system 22 analyzes the read values and provides a set of probability metrics for each read value, where each probability metric in the set of probability metrics for a read value corresponds to a statistical likelihood that the read value is representative of one of a number of symbols. The set of probability metrics for each read value may be provided to the de-mapper 24 as a symbol stream. The de-mapper 24 may convert the symbol stream to a bit stream and provide it as the read information source 26.

As discussed above, the storage media 12 in the storage system 10 may be a silica storage media, which is prone to read and write errors. The storage media 12 may thus be referred to as an unreliable or noisy communication channel. It is due to the unreliability of the storage media 12 that the machine learning system 22 is used to analyze the read values and provide the set of probability metrics so that it is more likely that a correct symbol for a read value will be chosen. However, in some cases, a signal to noise ratio (SNR) of the read values may still be too low to reliably reconstruct the data stored on the storage media 12. Accordingly, a bit error rate (BER) of the storage system 10 may be impermissibly high.

Error correcting code (ECC) and trellis coded modulation (TCM) have been used to reduce BER. Conventionally, TCM uses Euclidean distance between a received symbol stream and a number of allowed paths in a trellis to determine a survival path through the trellis that is used to decode a TCM stream. Euclidean distance is a proper metric for determining a survival path in a Gaussian channel. However, the storage system 10 discussed above is not a Gaussian channel due to the machine learning system 22, which provides sets of probability metrics. Accordingly, conventional TCM decoding based on Euclidean distance is not compatible with silica storage systems similar to the one discussed above with respect to FIG. 1. Principles of the present disclosure are directed to systems and methods for utilizing TCM and ECC to reduce BER in silica storage systems.

Figure 2:
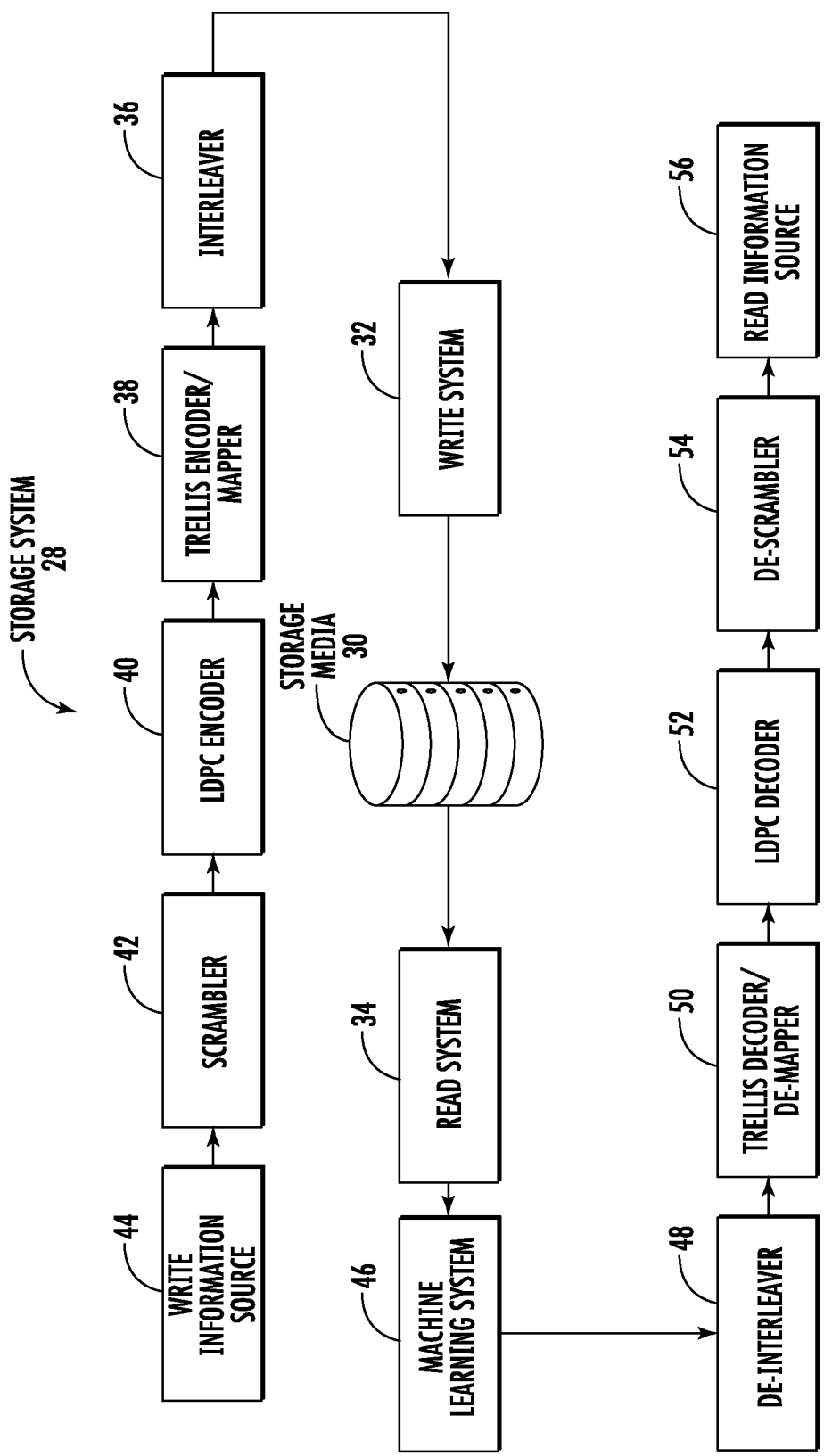
FIG. 2 illustrates a storage system according to one embodiment of the present disclosure.

FIG. 2 illustrates a storage system 28 according to one embodiment of the present disclosure. The storage system 28 includes a storage media 30, a write system 32 coupled to the storage media 30, and a read system 34 coupled to the storage media 30. The write system 32 is coupled to an interleaver 36, which is in turn coupled to a trellis encoder/mapper 38, which is in turn coupled to a low-density parity-check (LDPC) encoder 40, which is in turn coupled to a scrambler 42, which is in turn coupled to a write information source 44. The read system 34 is coupled to a machine learning system 46, which is in turn coupled to a de-interleaver 48, which is in turn coupled to a trellis decoder/de-mapper 50, which is in turn coupled to an LDPC decoder 52, which is in turn coupled to a de-scrambler 54, which is in turn coupled to a read information source 56.

To write data to the storage media 30, information from the write information source 44 is provided to the scrambler 42 as a bit stream. The scrambler 42 may scramble all or a portion of the bit stream to disrupt long sequences of bits having the same value. This may improve the performance of the storage media 30, which may not be optimized for storing long sequences having the same value. The scrambled bit stream is provided to the LDPC encoder 40, which encodes the bit stream using LDPC encoding to provide an LDPC encoded bit stream. Those skilled in the art will appreciate the details of LDPC encoding, and accordingly these details are not discussed herein. The LDPC encoded bit stream is provided to the trellis encoder/mapper 48, which encodes and maps the bit stream into a symbol stream according to a trellis that provides separation between allowable read symbol streams in order to reduce errors when reading data from the storage media 30 as discussed below. The symbol stream is provided to the interleaver 36, where symbols in the symbol stream are interleaved so that the symbols in the symbol stream are stored at different physical locations in the storage media 30. Since errors may be spatially correlated in the storage media 30, interleaving the symbol stream may reduce consecutive errors for a given symbol stream in the storage media 30. The interleaved symbol stream is provided to the write system 32, which facilitates writing of the interleaved symbol stream to the storage media 30.

To read data from the storage media 30, the read system 34 obtains read values from the storage media 30 and provides the read values to the machine learning system 46. The read values are representative of symbols in a symbol stream. The machine learning system 46 analyzes the read values and provides a set of probability metrics for each read value, where each probability metric in the set of probability metrics for a read value corresponds to a statistical likelihood that the read value is representative of one of a number of symbols. The set of probabilities are provided to the de-interleaver 48, where they are de-interleaved (reverse of the interleaving process performed by the interleaver 36) so that the sets of probability metrics are in the proper order to represent a symbol stream. The de-interleaved sets of probability metrics are provided to the trellis decoder/de-mapper 50, where they are used to determine a survival path through the trellis used by the trellis encoder/mapper 38 to encode and map data written to the storage media 30. Details of determining the survival path based on the sets of probability metrics are discussed below. The survival path is used to decode a symbol stream best represented by the read values, which is provided to the LDPC decoder 52. The LDPC decoder 52 performs further decoding on the symbol stream, and the output of the LDPC decoder 52 is provided to the de-scrambler 54. Those skilled in the art will appreciate the details of LDPC decoding, and accordingly these details are not discussed herein. The de-scrambler 54 de-scrambles the bit stream (reverse of the process performed by the scrambler 42) to reconstruct the bit stream as it was written to the storage media 30. The reconstructed bit stream is then provided as the read information source 56.

Using the trellis encoder/mapper 38 to encode and map data written to the storage media 30 and the trellis decoder/de-mapper 50 to decode and de-map data read from the storage media 30 may significantly reduce the BER of the storage system 28. Using the LDPC encoder 40 to encode data written to the storage media 30 and the LDPC decoder 52 to decode data read from the storage media 30 may further reduce the BER of the storage system 28.

Figure 3:
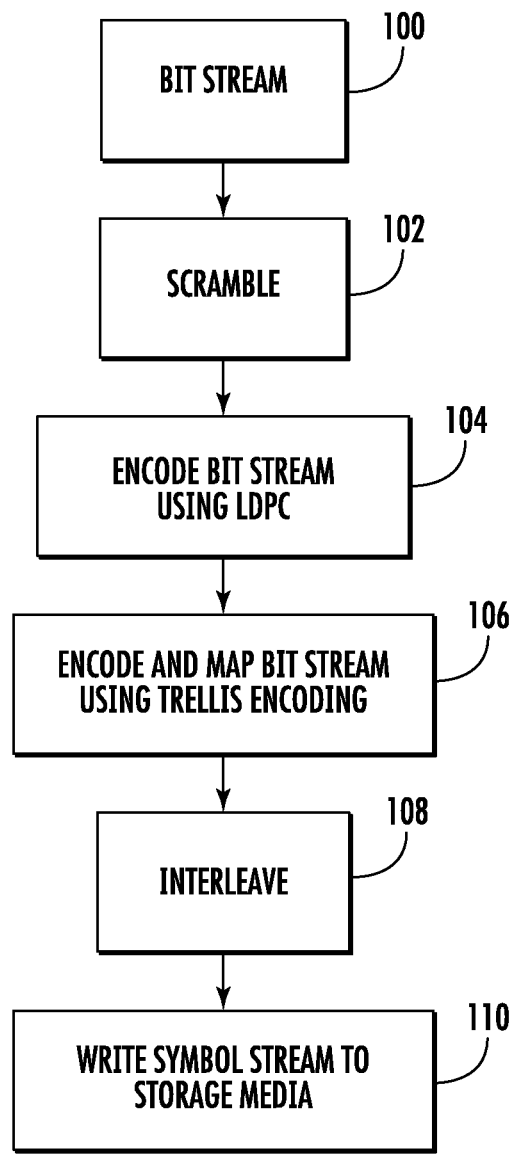
FIG. 3 is a flow diagram illustrating a method for storing data in a storage system according to one embodiment of the present disclosure.

FIG. 3 is a flow chart illustrating a method for storing data to the storage media 30 according to one embodiment of the present disclosure. The method begins with a bit stream (block 100), which may be the write information source 44. The bit stream is scrambled (block 102) by the scrambler 42, which as discussed above may include breaking up sequences of bits having the same value. The scrambled bit stream is encoded using LDPC (block 104) by the LDPC encoder 40. The bit stream may be encoded according to any suitable LDPC encoding scheme, which may be chosen to decrease errors that occur when reading data from the storage media 30. The encoded bit stream is then further encoded and mapped (block 106) by the trellis encoder/mapper 38 into a symbol stream. As discussed below, the trellis used by the trellis encoder/mapper 38 may be chosen to decrease errors that occur when reading data from the storage media 30. The symbol stream is interleaved (block 108) by the interleaver 36, which as discussed above may include interleaving symbols in the symbol stream so that symbols close to each other in the stream are stored in widely separated physical locations in the storage media 30. The interleaved symbol stream is then written to the storage media 30 (block 110) by the write system 32.

Figure 4:
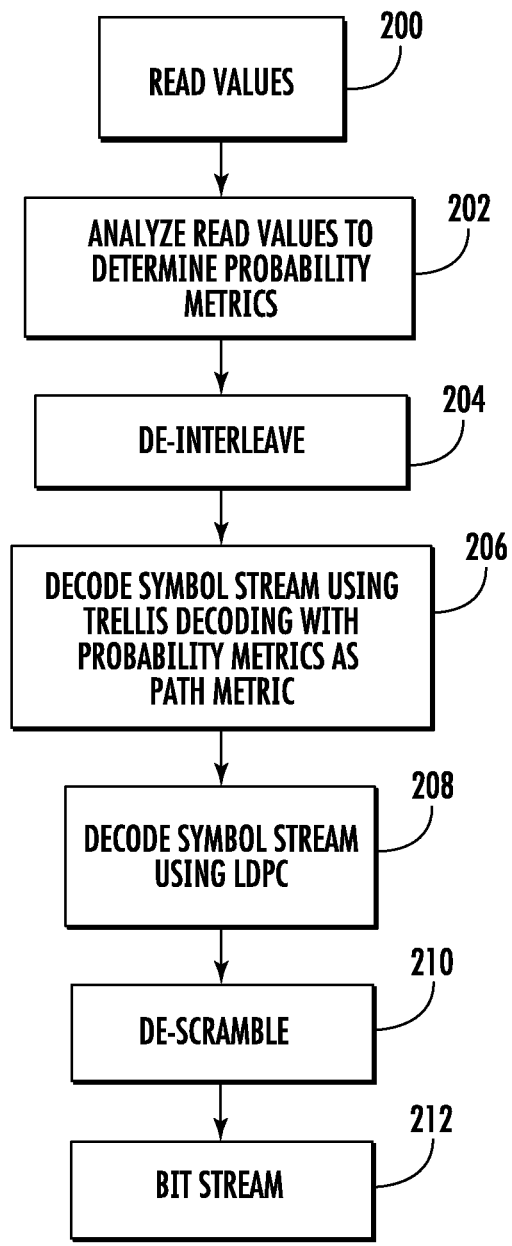
FIG. 4 is a flow diagram illustrating a method for retrieving data from a storage system according to one embodiment of the present disclosure.

FIG. 4 is a flow chart illustrating a method for reading data from the storage media 30 according to one embodiment of the present disclosure. The method begins with a number of read values (block 200), which may be obtained by the read system 34 from the storage media 30. The read values correspond to symbols in a symbol stream. The read values are analyzed by the machine learning system 46 to determine a set of probability metrics (block 202), where each probability metric in the set of probability metrics for a read value corresponds to the statistical likelihood that the read value is representative of one of a number of symbols. The sets of probability metrics are de-interleaved (block 204) by the de-interleaver 48 to reverse the process performed by the interleaver 36 such that the sets of probability metrics are in the proper order to represent a symbol stream.

The de-interleaved sets of probability metrics are decoded and de-mapped by the trellis decoder/de-mapper 50 into a symbol stream (block 206). This is done by using the sets of probability metrics to determine a survival path through the trellis used by the trellis encoder/mapper 38 to encode and map data stored to the storage media 30 as discussed in detail below. The symbol stream is then decoded by the LDPC decoder 52 into a bit stream (block 208). The bit stream is then de-scrambled (block 210) by the de-scrambler 54, which reverses the process performed by the scrambler 42 when storing data to the storage media 30. The resulting bit stream is provided (block 212) as the read information source 56.

Figure 5:
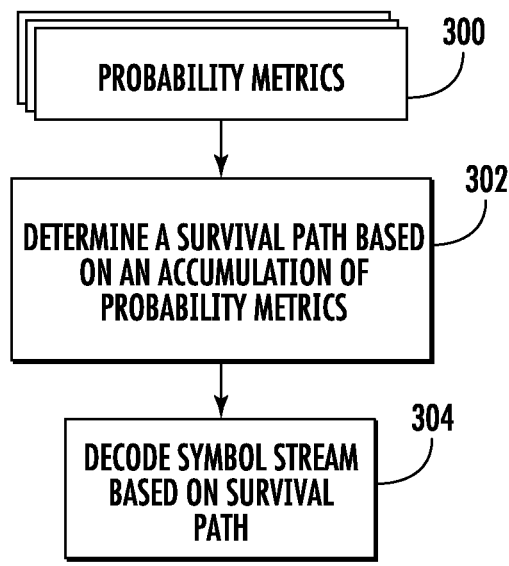
FIG. 5 is a flow diagram illustrating a method for decoding and de-mapping data according to one embodiment of the present disclosure.

FIG. 5 is a flow chart illustrating details of the trellis decoding/de-mapping performed by the trellis decoder/de-mapper 50 using the sets of probability metrics according to one embodiment of the present disclosure. First, a set of probability metrics for each one of a plurality of receive values are received (block 300). As discussed above, the set of probability metrics for a given receive value includes probability metrics that correspond to the statistical likelihood that the read value is representative of one of a number of symbols. A survival path is determined through the trellis used by the trellis encoder/mapper 38 to encode and map data that is written to the storage media 30 (block 302). The survival path is determined based on the set of probability metrics for each read value, rather than Euclidean distance as discussed below. The symbol stream represented by the read values is then decoded based on the survival path (block 304).

In a TCM scheme, a set of symbols defines a set of allowed transitions between a plurality of states. The number of states is determined arbitrarily by the TCM scheme. The symbols can be mapped to values in arbitrary ways, and the mapping between symbols and values is generally chosen to minimize the likelihood of errors. The particular choice of the trellis encoding scheme is outside of the scope of the present disclosure and therefore not discussed herein. A series of successive allowed transitions between the plurality of states defines an allowed path between the states, where several allowed paths generally exist between the states. In a conventional TCM decoding system, Euclidean distance between a received symbol stream and a number of symbol streams representing each allowed path in a trellis is compared and a survival path is chosen as the one of the allowed paths in the trellis having the smallest Euclidean distance to the received symbol stream. More specifically, each allowed path in the trellis includes a number of allowed transitions between states. For each allowed transition in each allowed path, the Euclidean distance between the symbol representing the allowed transition and a received symbol is accumulated as a path metric. The allowed path having the shortest path metric (smallest accumulated Euclidean distance) is chosen as the survival path. The inputs used to obtain the survival path, which are the values used to obtain the allowed transitions between the states of the survival path, represent a decoded bit stream.

Rather than using Euclidean distance to determine the survival path, the trellis decoder/de-mapper 50 uses the set of probability metrics for each read value. In particular, the trellis decoder/de-mapper 50 determines the survival path based on an accumulation of probability metrics corresponding to the statistical likelihood that successive ones of the plurality of read values are representative of successive ones of the symbols defining each transition in the survival path. As discussed above, each probability metric in a set of probability metrics for a read value corresponds to a statistical likelihood that the read value is representative of one of a number of symbols. For each allowed transition in each allowed path of the trellis used by the trellis encoder/mapper 38 to encode and map data written to the storage media 30, the probability metric corresponding to the symbol representing the allowed transition is accumulated as a path metric. Equation (1) illustrates the calculation of the path metric according to one embodiment of the present disclosure:

$$\text{Path Metric} = \Sigma \log P(S_i|r) \qquad (1)$$

where $P(S_i|r)$ is the posteori probability that a symbol $S_i$ was written when a read value r was observed, and each symbol $S_i$ corresponds to an allowed transition. The posteori probability is summed for each allowed transition in an allowed path, such that each allowed path is associated with a cumulative posteori probability for each allowed transition therein. The allowed path having the maximum path metric (largest accumulated probability metric) is chosen as the survival path. Then the symbol stream is determined from the survival path. A non-linear function such as the logarithm function can be applied to the probability metrics in order to make the implementation more practical. The use of other non-linear functions to weight the reliability estimates differently is also possible.

Figure 6:
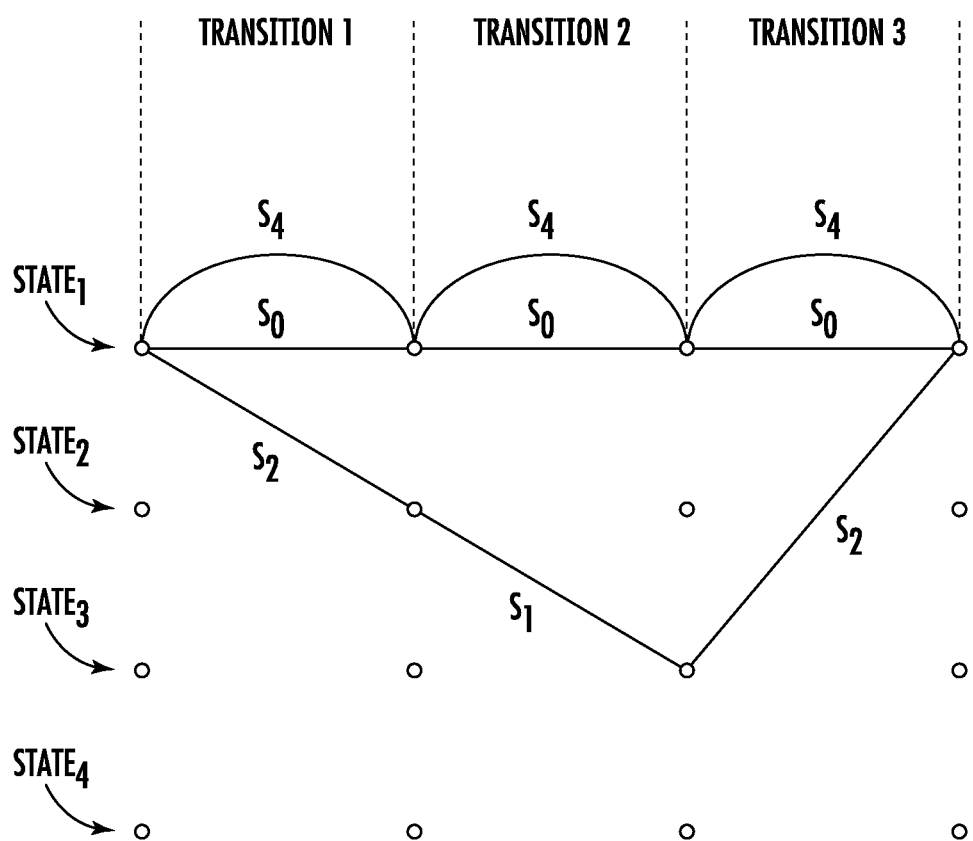
FIG. 6 illustrates principles of decoding and de-mapping data according to one embodiment of the present disclosure.

FIG. 6 illustrates an exemplary code trellis for purposes of explanation of the concepts discussed above. As shown, the code trellis includes four states. A number of symbols ($S_x$) define the allowed transitions between the states. To demonstrate decoding when three symbols are stored, three trellis transitions are illustrated. As discussed above, the trellis decoder/de-mapper 50 does not receive a received symbol stream, but rather receives a set of probability metrics for each symbol in a received symbol stream. Accordingly, in the present example the trellis decoder/de-mapper 50 receives three sets of probability metrics, one for each symbol in a received symbol stream. A first set of probability metrics is associated with a first transition (transition 1), a second set of probability metrics is associated with a second transition (transition 2), and a third set of probability metrics is associated with a third transition (transition 3). In the first transition, the first set of probability metrics is accumulated into a first path metric, a second path metric, and a third path metric. Since this is the beginning of the decoded sequence, the first path metric, the second path metric, and the third path metric start at zero. Specifically, the probability metric from the first set of probability metrics for $S_0$ is added to a first path metric, the probability metric from the first set of probability metrics for $S_4$ is added to a second path metric, and the probability metric from the first set of probability metrics for $S_2$ is added to a third path metric. Moving to the second transition, the probability metric from the second set of probability metrics for $S_0$ is added to the first path metric, the probability metric from the second set of probability metrics for $S_4$ is added to the second path metric, and the probability metric from the second set of probability metrics for $S_1$ is added to the third path metric. Moving to the third transition, the probability metric from the third set of probability metrics for $S_0$ is added to the first path metric, the probability metric from the third set of probability metrics for $S_4$ is added to the second path metric, and the probability metric from the third set of probability metrics for $S_2$ is added to the third path metric. The path having the largest path metric is designated as the survival path and used to decode the symbol stream for the read values. Well known algorithms such as the Viterbi algorithm and the soft output Viterbi algorithm (SOVA) may be used to quickly determine the survival path without evaluating all paths in the trellis.

Figure 7:
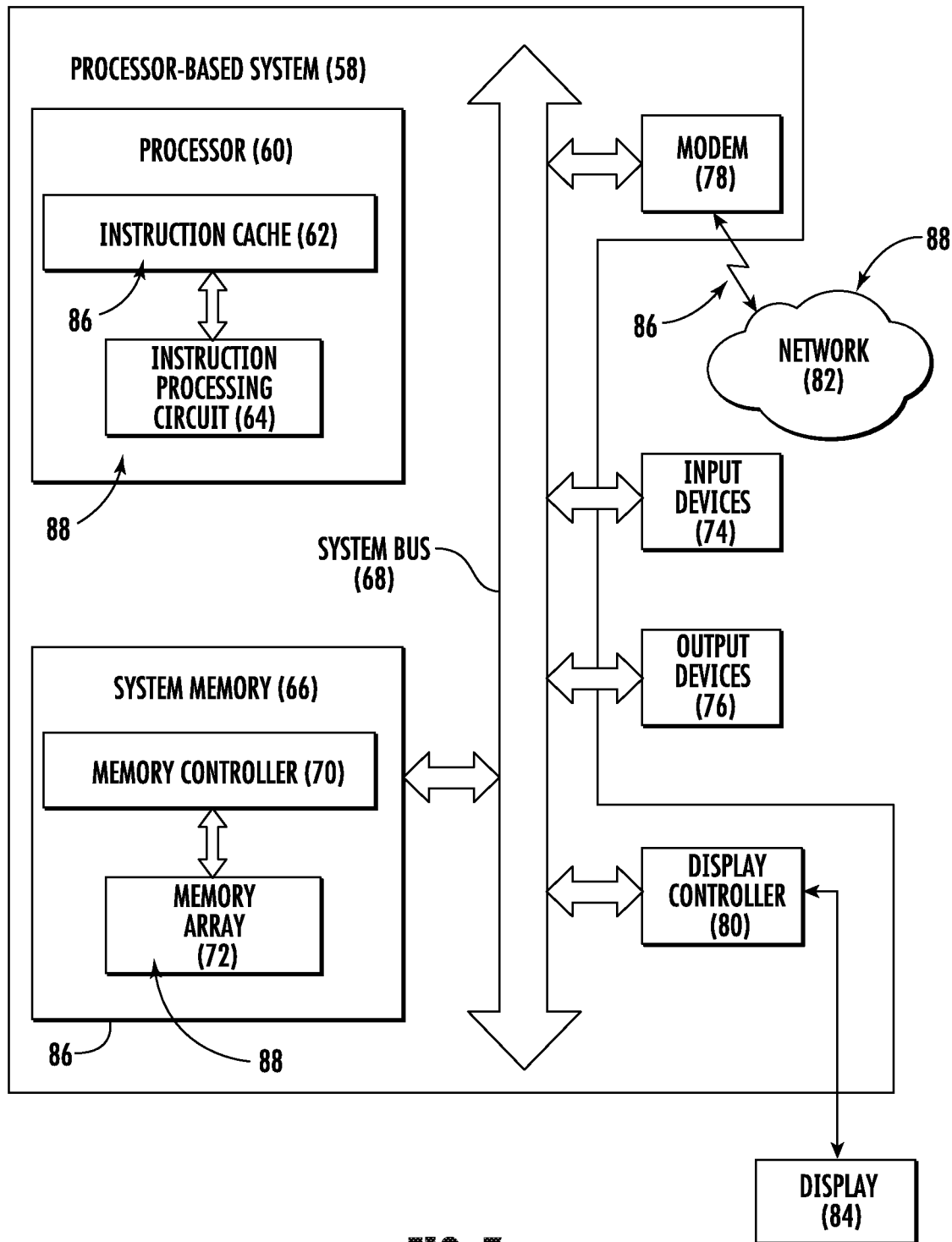
FIG. 7 illustrates a processor-based system for performing any of the data storage and retrieval concepts in various embodiments of the present disclosure.

FIG. 7 is a block diagram of an exemplary processor-based system 58 that includes a processor 60 configured to support any of the operations performed by the storage system 28 discussed herein. The processor-based system 58 may be a circuit or circuits included in an electronic board card, such as a printed circuit board (PCB), a server, a personal computer, a desktop computer, a laptop computer, a personal digital assistant (PDA), a computing pad, a mobile device, or any other device, and may represent, for example, a server or a user's computer. In this example, the processor-based system 58 includes the processor 60. The processor 60 represents one or more general-purpose processing circuits, such as a microprocessor, central processing unit, or the like. The processor 60 is configured to execute processing logic in instructions for performing the operations and steps discussed herein. In this example, the processor 60 includes an instruction cache 62 for temporary, fast access memory storage of instructions and an instruction processing circuit 64. Fetched or prefetched instructions from a memory, such as from a system memory 66 over a system bus 68, are stored in the instruction cache 62. The instruction processing circuit 64 is configured to process instructions fetched into the instruction cache 62 and process the instructions for execution.

The processor 60 and the system memory 66 are coupled to the system bus 68 and can intercouple peripheral devices included in the processor-based system 58. As is well known, the processor 60 communicates with these other devices by exchanging address, control, and data information over the system bus 68. For example, the processor 60 can communicate bus transaction requests to a memory controller 70 in the system memory 66 as an example of a slave device. Although not illustrated in FIG. 7, multiple system buses 68 could be provided, wherein each system bus 68 constitutes a different fabric. In this example, the memory controller 70 is configured to provide memory access requests to a memory array 72 in the system memory 66. The memory array 72 is comprised of an array of storage bit cells for storing data. The system memory 66 may be a read-only memory (ROM), flash memory, dynamic random-access memory (DRAM), such as synchronous DRAM (SDRAM), etc., and a static memory (e.g., flash memory, static random access memory (SRAM), etc.), as non-limiting examples.

Other devices can be connected to the system bus 68. As illustrated in FIG. 7, these devices can include the system memory 66, one or more input devices 74, one or more output devices 76, a modem 78, and one or more display controllers 80, as examples. The input devices 74 can include any type of input device, including but not limited to input keys, switches, voice processors, etc. The output devices 76 can include any type of output device, including but not limited to audio, video, other visual indicators, etc. The modem 78 can be any device configured to allow exchange of data to and from a network 82. The network 82 can be any type of network, including but not limited to a wired or wireless network, a private or public network, a local area network (LAN), a wireless local area network (WLAN), a wide area network (WAN), a BLUETOOTH™ network, and the Internet. The modem 78 can be configured to support any type of communications protocol desired. The processor 60 may also be configured to access the display controller(s) 80 over the system bus 68 to control information sent to one or more displays 84. The display(s) 84 can include any type of display, including but not limited to a cathode ray tube (CRT), a liquid crystal display (LCD), a plasma display, etc.

The processor-based system 58 in FIG. 7 may include a set of instructions 86 to be executed by the processor 60 for any application desired according to the instructions 86. The instructions 86 may be stored in the system memory 66, the processor 60, and/or the instruction cache 62 as examples of a non-transitory computer-readable medium 88. The instructions 86 may also reside, completely or at least partially, within the system memory 66 and/or within the processor 60 during their execution. The instructions 86 may further be transmitted or received over the network 82 via the modem 78, such that the network 82 includes the computer-readable medium 88.

While the computer-readable medium 88 is shown in an exemplary embodiment to be a single medium, the term "computer-readable medium" should be taken to include a single medium or multiple media (e.g., a centralized or distributed database, and/or associated caches and servers) that store the one or more sets of instructions. The term "computer-readable medium" shall also be taken to include any medium that is capable of storing, encoding, or carrying a set of instructions for execution by the processing device and that cause the processing device to perform any one or more of the methodologies of the embodiments disclosed herein. The term "computer-readable medium" shall accordingly be taken to include, but not be limited to, solid-state memories, optical medium, and magnetic medium.

The embodiments disclosed herein include various steps. The steps of the embodiments disclosed herein may be formed by hardware components or may be embodied in machine-executable instructions, which may be used to cause a general-purpose or special-purpose processor programmed with the instructions to perform the steps. Alternatively, the steps may be performed by a combination of hardware and software.

The embodiments disclosed herein may be provided as a computer program product, or software, that may include a machine-readable medium (or computer-readable medium) having stored thereon instructions, which may be used to program a computer system (or other electronic devices) to perform a process according to the embodiments disclosed herein. A machine-readable medium includes any mechanism for storing or transmitting information in a form readable by a machine (e.g., a computer). For example, a machine-readable medium includes: a machine-readable storage medium (e.g., ROM, random access memory ("RAM"), a magnetic disk storage medium, an optical storage medium, flash memory devices, etc.); and the like.

Unless specifically stated otherwise and as apparent from the previous discussion, it is appreciated that throughout the description, discussions utilizing terms such as "processing," "computing," "determining," "displaying," or the like, refer to the action and processes of a computer system, or similar electronic computing device, that manipulates and transforms data and memories represented as physical (electronic) quantities within the computer system's registers into other data similarly represented as physical quantities within the computer system memories or registers or other such information storage, transmission, or display devices.

The algorithms and displays presented herein are not inherently related to any particular computer or other apparatus. Various systems may be used with programs in accordance with the teachings herein, or it may prove convenient to construct more specialized apparatuses to perform the required method steps. The required structure for a variety of these systems will appear from the description above. In addition, the embodiments described herein are not described with reference to any particular programming language. It will be appreciated that a variety of programming languages may be used to implement the teachings of the embodiments as described herein.

Those of skill in the art will further appreciate that the various illustrative logical blocks, modules, circuits, and algorithms described in connection with the embodiments disclosed herein may be implemented as electronic hardware, instructions stored in memory or in another computer-readable medium and executed by a processor or other processing device, or combinations of both. The components of the storage systems described herein may be employed in any circuit, hardware component, integrated circuit (IC), or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends on the particular application, design choices, and/or design constraints imposed on the overall system. Skilled artisans may implement the described functionality in varying ways for each particular application, but such implementation decisions should not be interpreted as causing a departure from the scope of the present embodiments.

The various illustrative logical blocks, modules, and circuits described in connection with the embodiments disclosed herein may be implemented or performed with a processor, a Digital Signal Processor (DSP), an Application Specific Integrated Circuit (ASIC), a Field Programmable Gate Array (FPGA), or other programmable logic device, a discrete gate or transistor logic, discrete hardware components, or any combination thereof designed to perform the functions described herein. Furthermore, a controller may be a processor. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The embodiments disclosed herein may be embodied in hardware and in instructions that are stored in hardware, and may reside, for example, in RAM, flash memory, ROM, Electrically Programmable ROM (EPROM), Electrically Erasable Programmable ROM (EEPROM), registers, a hard disk, a removable disk, a CD-ROM, or any other form of computer-readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary embodiments herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary embodiments may be combined. Those of skill in the art will also understand that information and signals may be represented using any of a variety of technologies and techniques. For example, data, instructions, commands, information, signals, bits, symbols, and chips, that may be references throughout the above description, may be represented by voltages, currents, electromagnetic waves, magnetic fields, or particles, optical fields or particles, or any combination thereof.

Unless otherwise expressly stated, it is in no way intended that any method set forth herein be construed as requiring that its steps be performed in a specific order. Accordingly, where a method claim does not actually recite an order to be followed by its steps, or it is not otherwise specifically stated in the claims or descriptions that the steps are to be limited to a specific order, it is in no way intended that any particular order be inferred.

It will be apparent to those skilled in the art that various modifications and variations can be made without departing from the spirit or scope of the invention. Since modifications, combinations, sub-combinations and variations of the disclosed embodiments incorporating the spirit and substance of the invention may occur to persons skilled in the art, the invention should be construed to include everything within the scope of the appended claims and their equivalents.

What is claimed is:

1. A method for data retrieval comprising:
receiving a plurality of read values;
generating a set of probability metrics for each one of the plurality of read values, each probability metric of the set of probability metrics corresponding to a statistical likelihood that the read value is representative of one of a plurality of symbols, wherein:
the plurality of symbols defines a set of allowed transitions between a plurality of states and a series of successive allowed transitions between the plurality of states defines allowed paths between the plurality of states; and
each one of the plurality of read values is based on a change in one or more optical properties of a silica glass storage media;
determining a survival path between the plurality of states based on an accumulation of probability metrics corresponding to the statistical likelihood that successive ones of the plurality of read values are representative of successive ones of the symbols defining each transition in the survival path; and
decoding a symbol stream encoded by the plurality of read values based on the survival path.

2. The method of claim 1 further comprising decoding the symbol stream encoded by the plurality of read values based on a low-density parity-check (LDPC) decoding scheme.

3. The method of claim 1 wherein generating the set of probability metrics for each one of the plurality of read values comprises analyzing each one of the plurality of read values using a machine learning system to generate the set of probability metrics.

4. The method of claim 1 wherein generating the set of probability metrics for each one of the plurality of read values comprises analyzing each one of the plurality of read values using a machine learning system.

5. The method of claim 1 wherein determining the survival path between the plurality of states is based on the accumulation of probability metrics after a non-linear function is applied to each probability metric in the accumulation of probability metrics.

6. The method of claim 5 wherein the non-linear function is a logarithmic function.

7. The method of claim 1 further comprising de-interleaving the sets of received probability metrics before determining the survival path.

8. The method of claim 1 wherein determining the survival path between the plurality of states is further based on a Viterbi process.

9. A data retrieval device comprising:
processing circuitry; and
a memory coupled to the processing circuitry, the memory storing instructions, which, when executed by the processing circuitry cause the data retrieval device to:
receive a plurality of read values;
generate a set of probability metrics for each one of the plurality of read values, each probability metric of the set of probability metrics corresponding to a statistical likelihood that the read value is representative of one of a plurality of symbols, wherein:
the plurality of symbols defines a set of allowed transitions between a plurality of states and a series of successive allowed transitions between the plurality of states defines allowed paths between the plurality of states; and
each one of the plurality of read values is based on a change in one or more optical properties of a silica glass storage media;
determine a survival path between the plurality of states based on an accumulation of probability metrics corresponding to the statistical likelihood that successive ones of the plurality of read values are representative of successive ones of the symbols defining each transition in the survival path; and decode a symbol stream encoded by the read values based on the survival path.

10. The data retrieval device of claim 9 wherein the memory stores further instructions, which, when executed by the processing circuitry cause the data retrieval device to decode the symbol stream encoded by the plurality of read values based on a low-density parity-check (LDPC) decoding scheme.

11. The data retrieval device of claim 9 wherein generating the set of probability metrics for each one of the plurality of read values comprises analyzing each one of the plurality of read values using a machine learning system to generate the set of probability metrics.

12. The data retrieval device of claim 9 wherein generating the set of probability metrics for each one of the plurality of read values comprises analyzing each one of the plurality of read values using a machine learning system.

13. The data retrieval device of claim 9 wherein determining the survival path between the plurality of states is based on the accumulation of probability metrics after a non-linear function is applied to each probability metric in the accumulation of probability metrics.

14. The data retrieval device of claim 13 wherein the non-linear function is a logarithmic function.

15. The data retrieval device of claim 9 wherein the memory stores further instructions, which, when executed by the processing circuitry cause the data retrieval device to de-interleave the set of received probability metrics before determining the survival path.

16. A non-transitory computer-readable medium having stored thereon executable instructions which, when executed by a processor, cause the processor to:

receive a plurality of read values;

analyze each one of the plurality of read values using a machine learning system to generate a set of probability metrics for each one of the plurality of read values, each probability metric of the set of probability metrics corresponding to a statistical likelihood that the read value is representative of one of a plurality of symbols, wherein the plurality of symbols defines a set of allowed transitions between a plurality of states and a series of successive allowed transitions between the plurality of states defines allowed paths between the plurality of states;

determine a survival path between the plurality of states based on an accumulation of probability metrics corresponding to the statistical likelihood that successive ones of the plurality of read values are representative of successive ones of the symbols defining each transition in the survival path; and decode a symbol stream encoded by the read values based on the survival path.

\* \* \* \* \*